(12) United States Patent
Noh et al.

(10) Patent No.: US 8,551,674 B2
(45) Date of Patent: Oct. 8, 2013

(54) PHOTOMASK HAVING TRANSCRIBING PATTERN AND METHOD OF FORMING PHOTORESIST PATTERN USING THE SAME

(75) Inventors: So-Young Noh, Seoul (KR); Seung-Ryull Park, Goyang-si (KR); Jin-Pil Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 180 days.

(21) Appl. No.: 13/188,306

(22) Filed: Jul. 21, 2011

(65) Prior Publication Data
US 2012/0021342 A1 Jan. 26, 2012

(30) Foreign Application Priority Data
Jul. 21, 2010 (KR) .................. 10-2010-0070613

(51) Int. Cl.
*G03F 1/38* (2012.01)

(52) U.S. Cl.
USPC ............................................................ 430/5

(58) Field of Classification Search
USPC .............................. 430/5, 322, 323, 324, 394
See application file for complete search history.

(56) References Cited

U.S. PATENT DOCUMENTS

| | | | | |
|---|---|---|---|---|
| 5,879,838 A | * | 3/1999 | Lee | 430/5 |
| 7,598,005 B2 | * | 10/2009 | Yamamoto | 430/5 |

* cited by examiner

*Primary Examiner* — Stephen Rosasco
(74) *Attorney, Agent, or Firm* — Birch, Stewart, Kolasch & Birch, LLP

(57) ABSTRACT

A photomask for a proximate type exposure apparatus includes: a transparent substrate; and a transcribing pattern and a peripheral region surrounding the transcribing pattern on the transparent substrate, the transcribing pattern having at least one bar including a plurality of discontinuous regions and a plurality of light controlling regions between the two adjacent discontinuous regions, the plurality of discontinuous regions capable of forming at least one continuous photoresist bar by exposing and developing a photoresist material.

18 Claims, 23 Drawing Sheets vertical length(B1)=3.5 μm width of photoresist pattern vertical length(B1)=4.0 μm width of photoresist pattern gap distance(C1)=15μm width of photoresist pattern

PHOTOMASK HAVING TRANSCRIBING PATTERN AND METHOD OF FORMING PHOTORESIST PATTERN USING THE SAME

This application claims the benefit of Korean Patent Application No. 10-2010-0070613, filed on Jul. 21, 2010, which is hereby incorporated by reference in its entirety.

BACKGROUND OF THE INVENTION

1. Field of the Invention

The present invention relates to a photomask having a transcribing pattern, and more particularly, to a photomask having a transcribing pattern for obtaining a fine photoresist pattern surpassing a resolution limit of an exposure apparatus and a method of forming a photoresist pattern using the photomask.

2. Discussion of the Related Art

In general, a semiconductor device or a display device is fabricated by repeatedly performing a step of forming a thin film on a substrate through deposition, a step of forming a photoresist pattern on the thin film through coating and patterning a photoresist material and a step of forming a thin film pattern through etching the thin film.

The step of forming the photoresist pattern includes a step of coating the photoresist material on the thin film and a step of irradiating a light onto the photoresist material using a photomask having a transcribing pattern. The irradiation onto the photoresist material is performed by an exposure apparatus. The exposure apparatus may be classified into a proximate type and a projection type according to a distance between the photomask and the substrate. In the proximate type exposure apparatus, since the photomask and the substrate are disposed adjacent to each other, a resolution for the photoresist pattern is relatively low. In the projection type exposure apparatus, since an optic system including a plurality of lenses is disposed between the photomask and the substrate, a resolution for the photoresist pattern is improved.

Accordingly, it is preferable to use the projection type exposure apparatus for forming the photoresist pattern. However, since the projection type exposure apparatus has a high price and a low exposure speed as compared with the proximate type exposure apparatus, the proximate type exposure apparatus may be used based on the production cost.

A method of forming a photoresist pattern using a proximate type exposure apparatus will be illustrated referring to drawings hereinafter.

FIGS. 1A and 1B are cross-sectional views showing a method of forming a photoresist pattern according to the related art, and FIG. 2 is a plan view showing a photomask according to the related art.

In general, a transcribing pattern on a photomask has various shapes according to a type of a photoresist material. For example, since an exposed portion of a negative type photoresist material remains to become a photoresist pattern, a transcribing pattern of a photomask for the negative type photoresist material may be formed as a transmissive pattern that a light penetrates. Further, since a non-exposed portion of a positive type photoresist material remains to become a photoresist pattern, a transcribing pattern of a photomask for the positive type photoresist material may be formed as a shielding pattern that blocks a light.

In FIG. 1A, a photoresist (PR) film 14 is formed on a substrate 12 by coating a negative type photoresist material. The substrate 12 having the photoresist film 14 is transferred to a proximate type exposure apparatus (not shown) and a photomask 16 having a transcribing pattern 18 is disposed over the substrate 12. In the proximate type exposure apparatus, a distance between the photomask 16 and the substrate 12 may be kept to be several micrometers.

In FIG. 2, the transcribing pattern 18 having a stripe shape of a plurality of bars is formed on the photomask 16. Since the photomask 16 is used for a negative type photoresist material, a portion of the photomask 16 corresponding to the transcribing pattern 18 functions as a transmissive area where a light passes and the other portion of the photomask 16 except the transcribing pattern 18 functions as a blocking area which blocks a light. Each bar of the transcribing pattern 18 has a continuous region without discontinuity.

In FIG. 1B, a light is irradiated onto the photoresist film 14 (of FIG. 1A) on the substrate 12 to form a photoresist pattern 20. The photoresist pattern 20 on the substrate 12 has a similar shape to the transcribing pattern 18 of the photomask 16. In addition, a first width w1 of the transcribing pattern 18 is smaller than a second width w2 of the photoresist pattern 20. The difference between the first and second widths w1 and w2 may be defined as a critical dimension bias.

For example, when the photomask 16 that has the transcribing pattern 18 having the first width w1 of about 10 μm is used for the proximate type exposure apparatus, the photoresist pattern 20 may have the second width w2 of about 17 μm to about 20 μm. Accordingly, the proximate type exposure apparatus may have a critical dimension bias of about 7 μm to about 10 μm. The width of the photoresist pattern 18 may be influenced by an amount of exposure and a gap between the photomask 16 and the substrate 12.

When the proximate exposure apparatus is used, the second first width w2 of the photoresist pattern 20 on the substrate 12 may be adjusted by controlling the first width w1 of the transcribing pattern 18 of the photomask 16 or by controlling the amount of exposure and the gap. However, when the photoresist pattern 20 is designed to have the second width w2 smaller than about 7 μm, the transcribing pattern 18 may not be formed on the photomask 16 due to the critical dimension bias. Since the photoresist pattern 20 having the second width w2 smaller than about 7 μm is not obtained from the photoresist film 14 by using the proximate type exposure apparatus, the projection type exposure apparatus of a relatively higher price and a relatively longer exposure time is required for the photoresist pattern 20 having the second width w2 smaller than about 7 μm.

SUMMARY OF THE INVENTION

Accordingly, the present invention is directed to a photomask having a transcribing pattern and a method of forming a photoresist pattern using the same that substantially obviate one or more of the problems due to limitations and disadvantages of the related art.

An advantage of the present invention is to provide a photomask having a transcribing pattern for a fine photoresist pattern surpassing a resolution limit of a proximate type exposure apparatus and a method of forming a photoresist pattern using the photomask.

Another advantage of the present invention is to provide a photomask having a transcribing pattern that includes a plurality of discontinuous regions and a plurality of light controlling regions between the adjacent discontinuous regions and a method of forming a continuous photoresist pattern using the photomask.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a photomask for a proximate type exposure apparatus includes: a transparent substrate; and a transcribing pattern and a peripheral region surrounding the transcribing pattern on the transparent substrate, the transcribing pattern having at least one bar including a plurality of discontinuous regions and a plurality of light controlling regions between the two adjacent discontinuous regions, the plurality of discontinuous regions capable of forming at least one continuous photoresist bar by exposing and developing a photoresist material.

In another aspect, a method of forming a photoresist pattern includes: forming a photoresist film on a substrate; disposing a photomask over the photoresist film, the photomask having a transcribing pattern and a peripheral region surrounding the transcribing pattern, the transcribing pattern having at least one bar including a plurality of discontinuous regions and a plurality of light controlling regions between the two adjacent discontinuous regions; forming the photoresist pattern by exposing and developing the photoresist film, the photoresist pattern having at least one continuous photoresist bar corresponding to the plurality of discontinuous regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, similar reference numbers will be used to refer to the same or similar parts.

In the present invention, a photomask having a transcribing pattern that includes a plurality of discontinuous regions and a plurality of light controlling regions between the adjacent discontinuous regions is used for forming a fine photoresist pattern surpassing a resolution limit of a proximate type exposure apparatus. The plurality of light controlling regions adjust an amount of the light passing through the photomask using a diffraction phenomenon.

The plurality of discontinuous regions of the transcribing pattern have various shapes according to a type of a photoresist material. For example, since an exposed portion of a negative type photoresist material remains to become a photoresist pattern, the plurality of discontinuous regions of the transcribing pattern for the negative type photoresist material may be formed as a transmissive area that a light penetrates. Further, since a non-exposed portion of a positive type photoresist material remains to become a photoresist pattern, the plurality of discontinuous regions of the transcribing pattern for the positive type photoresist material may be formed as a shielding area that blocks a light.

Similarly to the plurality of discontinuous regions, the plurality of light controlling regions have various shapes according to a type of a photoresist material. For example, the plurality of light controlling regions of the transcribing pattern may be formed as a shielding area for the negative type photoresist material and the plurality of light controlling regions of the transcribing pattern may be formed as a transmissive area for the positive type photoresist material.

Figure 1A:
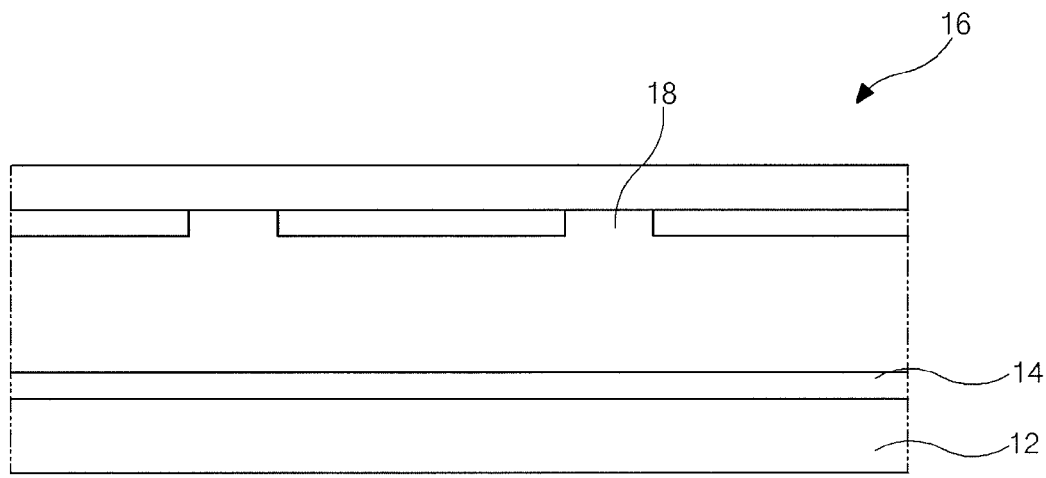
FIGS. 1A and 1B are cross-sectional views showing a method of forming a photoresist pattern according to the related art.
Figure 1B:
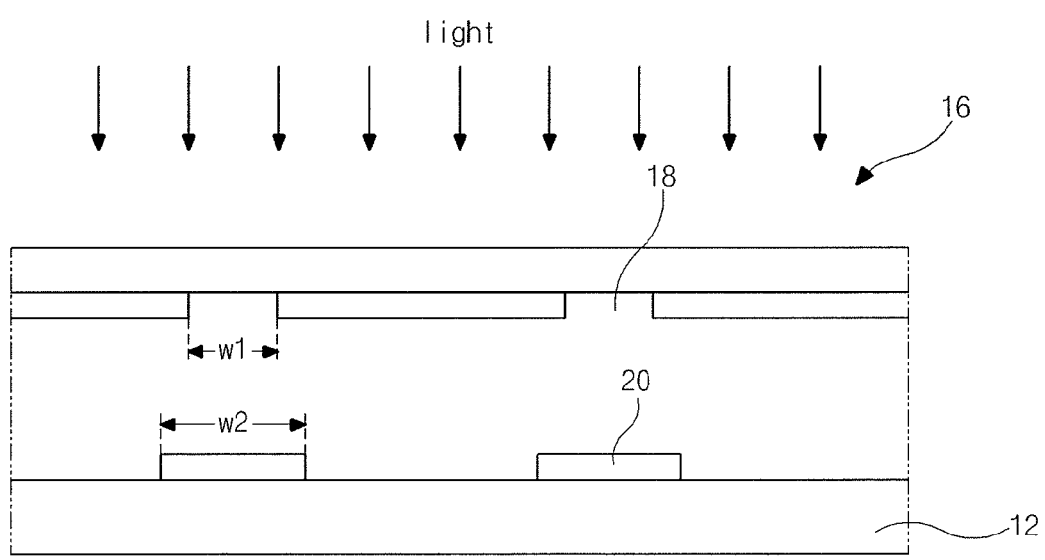
Figure 2:
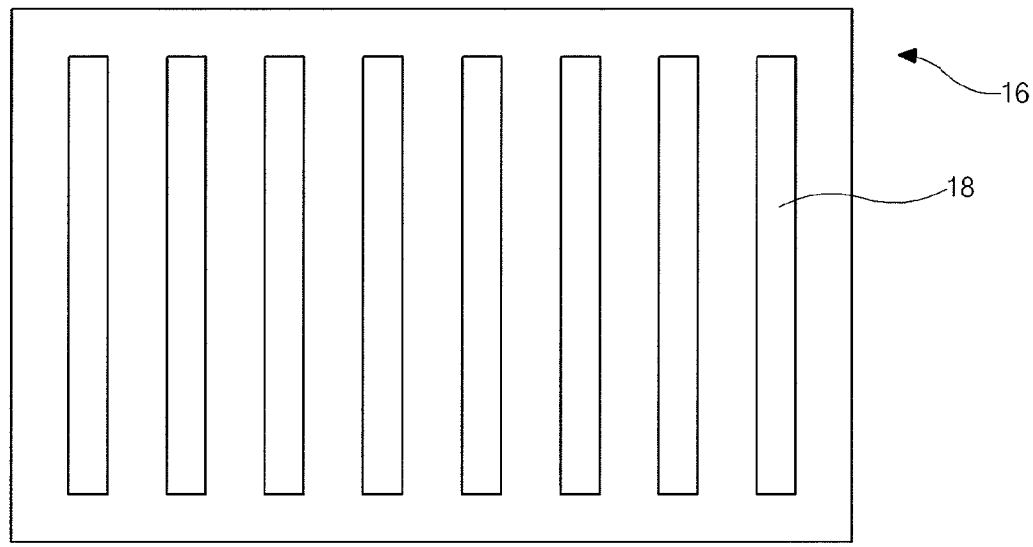
FIG. 2 is a plan view showing a photomask according to the related art.
Figure 3A:
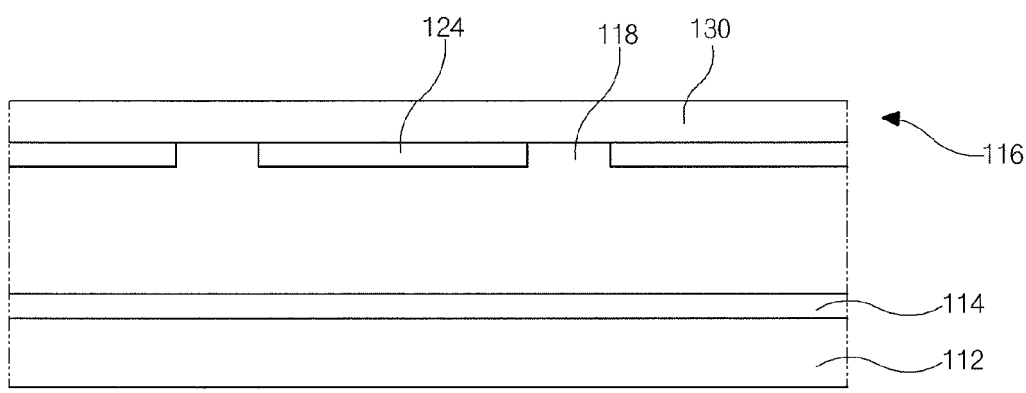
FIGS. 3A and 3B are cross-sectional views showing a method of forming a photoresist pattern according to a first embodiment.
Figure 3B:
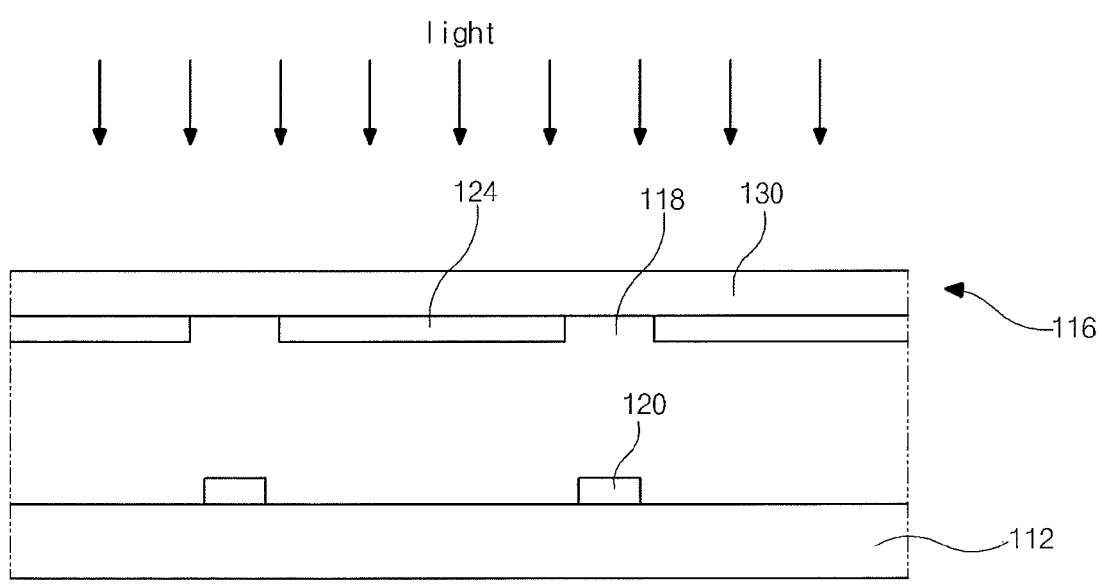
Figure 4:
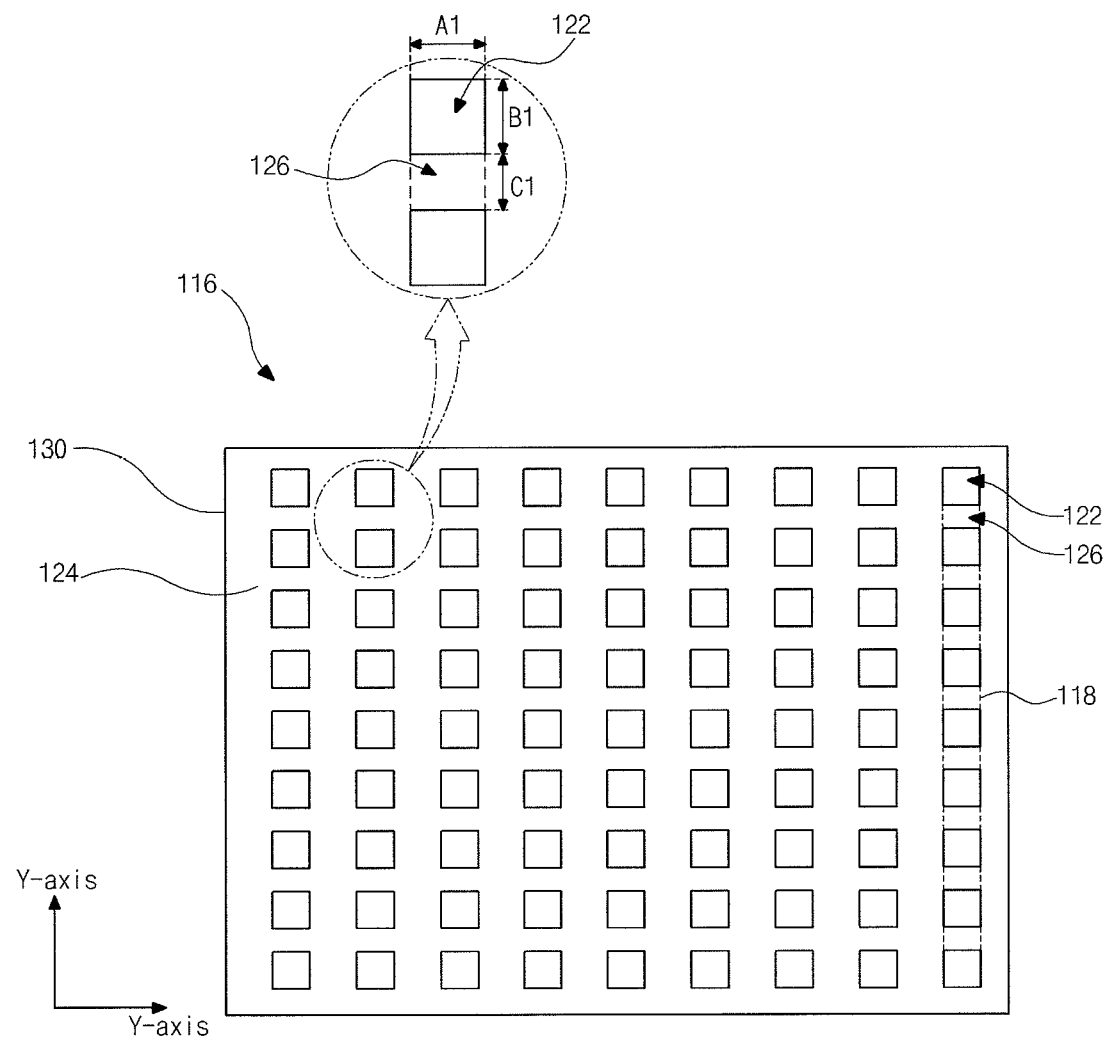
FIG. 4 is a plan view showing a photomask according to a first embodiment of the present invention.
Figure 5:
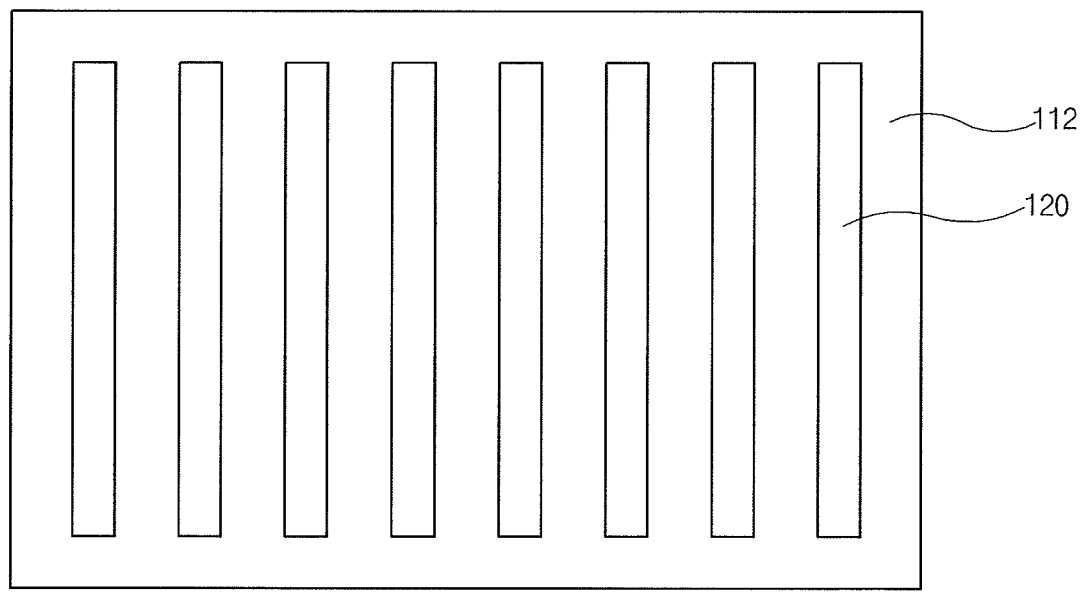
FIG. 5 is a plan view showing a photoresist pattern formed by using a photomask according to a first embodiment of the present invention.

FIGS. 3A and 3B are cross-sectional views showing a method of forming a photoresist pattern according to a first embodiment, FIG. 4 is a plan view showing a photomask according to a first embodiment of the present invention, and FIG. 5 is a plan view showing a photoresist pattern formed by using a photomask according to a first embodiment of the present invention.

In FIG. 3A, a photoresist (PR) film 114 is formed on a substrate 112 by coating a negative type photoresist material. The substrate 112 having the photoresist film 114 is transferred to a proximate type exposure apparatus (not shown) and a photomask 116 is disposed over the substrate 112. In the proximate type exposure apparatus, a distance between the photomask 116 and the photoresist film 114 on the substrate 112 may be kept to be several hundreds micrometers.

In FIG. 3B, a light is irradiated onto the photoresist film 114 (of FIG. 3A) on the substrate 112 through the photomask 116 and the exposed photoresist film 114 is developed to form a photoresist pattern 120.

In FIGS. 4 and 5, the photomask 116 for a negative photoresist material includes a transparent substrate 130 and a transcribing pattern 118 and a peripheral shielding region 124 on the transparent substrate 130. The transcribing pattern 118 includes a plurality of bars and the peripheral shielding region 124 surrounds the transcribing pattern 118. The transcribing pattern 118 and the peripheral shielding region 124 constitute a stripe shape. Each bar of the transcribing pattern 118 includes a plurality of discontinuous regions 122 and a plurality of light controlling regions 126. The plurality of discontinuous regions 122 function as a transmissive area where a light passes, and the peripheral shielding region 124 and the plurality of light controlling regions 126 function as a blocking area which blocks a light.

The plurality of discontinuous regions 122 are disposed along a first direction (a Y-axis) discontinuously and each of the plurality of light controlling regions 126 is disposed between the two adjacent discontinuous regions 122. When a light is irradiated through the photomask 116, a diffraction occurs at the plurality of discontinuous regions 122 of the transcribing pattern 118 and the photoresist film 114 (of FIG. 3A) corresponding to the plurality of light controlling regions 126 are exposed to the diffracted light. Although the plurality of discontinuous regions 122 has discontinuities, a photoresist pattern 120 including a plurality of continuous photoresist bars that correspond to the plurality of bars of the transcribing pattern 118 is formed on the substrate 112 due to diffraction. Accordingly, the fine photoresist pattern 120 of a stripe shape including the plurality of continuous photoresist bars is obtained by using the photomask 116 having the transcribing pattern 118 that includes the plurality of discontinuous regions 122 and the plurality of light controlling regions 126.

The shape of the photoresist pattern 120 obtained by using the photomask 116 may be adjusted by a horizontal length A1 of each discontinuous region 122, a vertical length B1 of each discontinuous region 122 and a gap distance C1 between the two adjacent discontinuous regions 122 (i.e., a vertical length of each light controlling region 126).

Figure 6A:
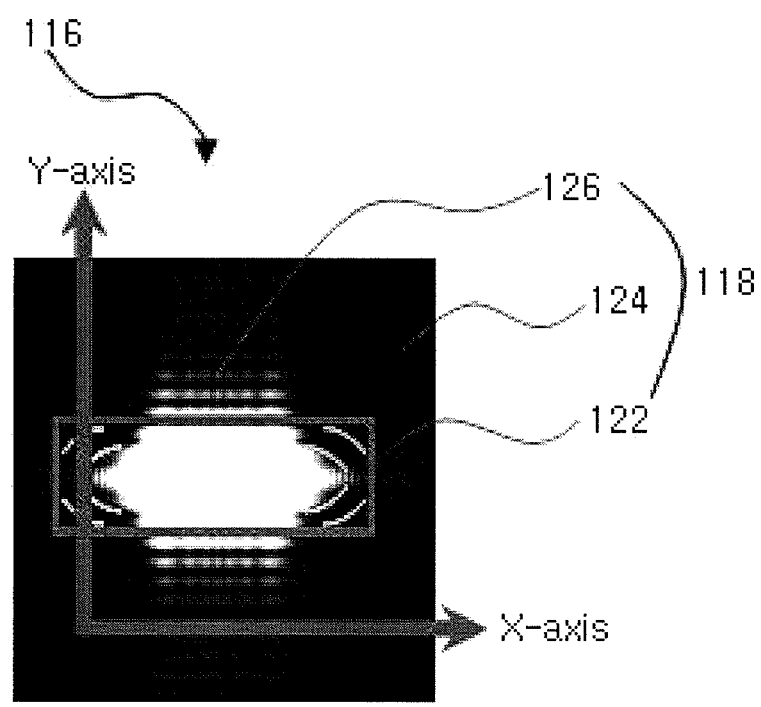
FIGS. 6A and 6B are two dimensional and three dimensional simulation results, respectively, showing a light distribution due to diffraction through a photomask according to a first embodiment of the present invention.
Figure 6B:
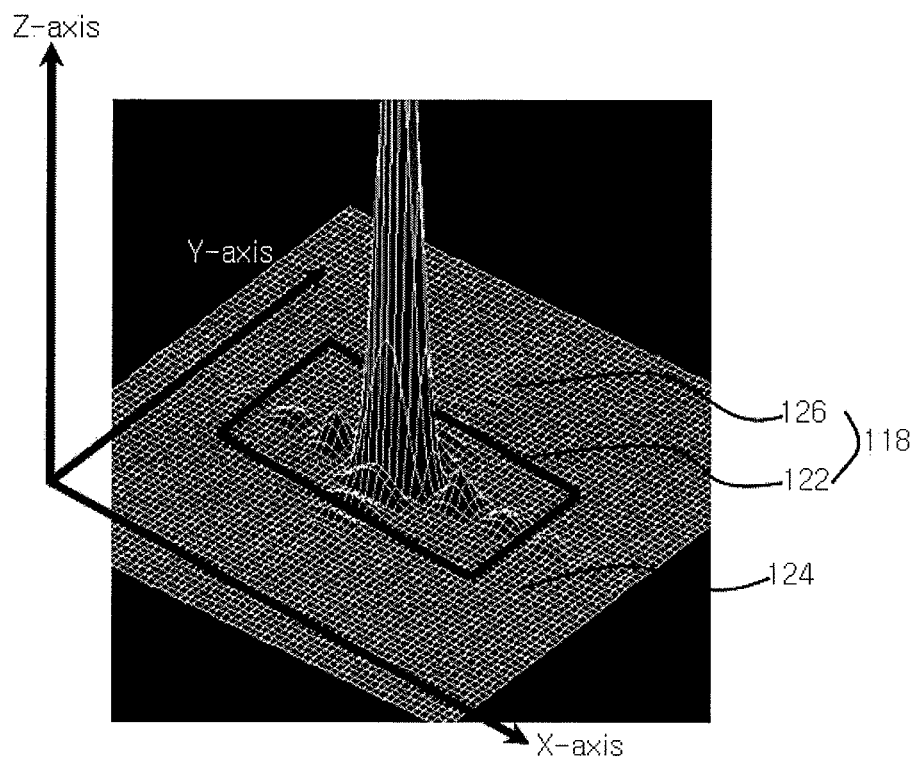

FIGS. 6A and 6B are two dimensional and three dimensional simulation results, respectively, showing a light distribution due to diffraction through a photomask according to a first embodiment of the present invention. In FIGS. 6A and 6B, an X-axis and a Y-axis represent a plane of the photomask and a Z-axis represents an intensity of light.

In FIGS. 6A and 6B, the photomask 116 for a negative photoresist material has the transcribing pattern 118 including the plurality of discontinuous regions 122 and the plurality of light controlling regions 126 and the peripheral shielding region 124. The plurality of discontinuous regions 122 function as a transmissive area and the plurality of light controlling regions 126 and the peripheral shielding region 124 function as a blocking area. When a light such as ultraviolet (UV) is irradiated through the photomask 116, a diffraction pattern where a bright point having a higher intensity and a dark point having a lower intensity alternate with each other is inspected at each of the plurality of discontinuous regions 122.

The light passing through a central portion of each of the plurality of discontinuous regions 122 has the greatest intensity and the light corresponding to a portion farther from the central portion of each of the plurality of discontinuous regions 122 has the lower intensity. A gap distance between two adjacent discontinuous regions 122 along the Y-axis is smaller than a gap distance between two adjacent discontinuous regions 122 along the X-axis. Accordingly, the light corresponding to each of the plurality of light controlling regions 126 between the two adjacent discontinuous regions 122 along the Y-axis has a relatively high intensity due to constructive interference by diffraction, while the light corresponding to the peripheral shielding region 124 between the two adjacent discontinuous regions 122 along the X-axis has a relatively low intensity. As a result, the photoresist film 114 (of FIG. 3A) corresponding to each of the plurality of light controlling regions 126 between the two adjacent discontinuous regions 122 along the Y-axis is exposed to the light having a relatively high intensity and is chemically converted so that the photoresist film 114 can remain after a developing step, while the photoresist film 114 corresponding to the peripheral shielding region 124 between the two adjacent discontinuous regions 122 along the X-axis is not exposed to the light having a relatively high intensity so that the photoresist film 114 can be removed after the developing step.

After the light is irradiated onto the photoresist film 114 through the photomask 116 and the photoresist film 114 is developed, the photoresist film 114 corresponding to the plurality of discontinuous regions 122 and the plurality of light controlling regions 126 remains and the photoresist film 114 corresponding to the peripheral shielding region 124 is removed due to the constructive interference by diffraction so that the photoresist pattern 120 having a stripe shape can be obtained. Accordingly, the plurality of continuous photoresist bars each having a width surpassing a resolution limit of a proximate type exposure apparatus are formed by using the photomask 116 having the plurality of discontinuous regions 122 due to diffraction.

FIGS. 7A to 7H are views showing a plurality of discontinuous regions of a photomask according to a first embodiment of the present invention.

Figure 7A:
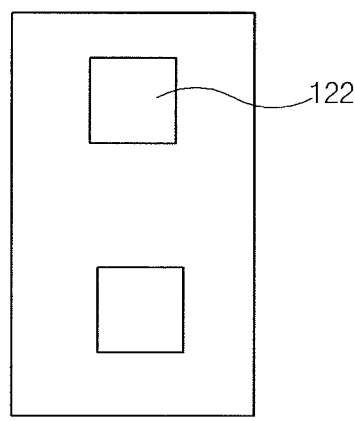
FIGS. 7A to 7H are views showing a plurality of discontinuous regions of a photomask according to a first embodiment of the present invention.
Figure 7B:
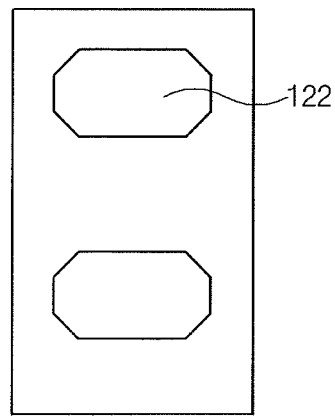
Figure 7C:
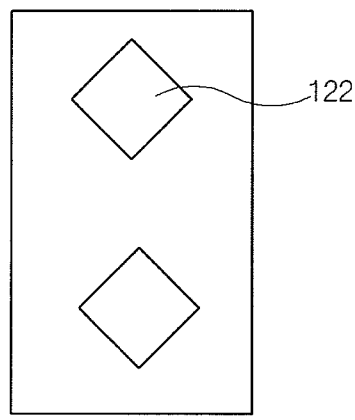
Figure 7D:
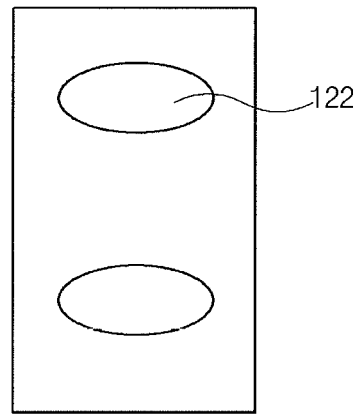
Figure 7E:
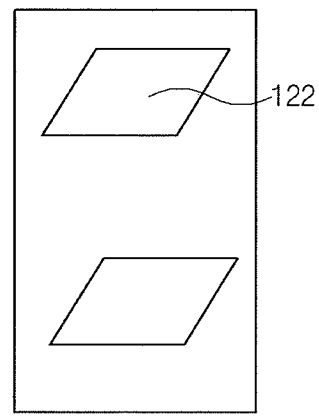
Figure 7F:
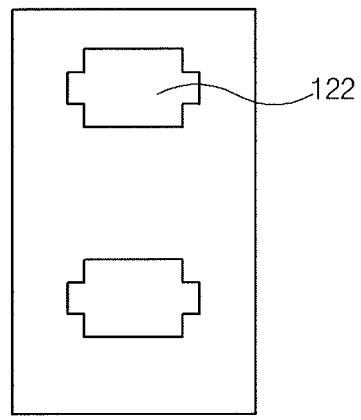
Figure 7G:
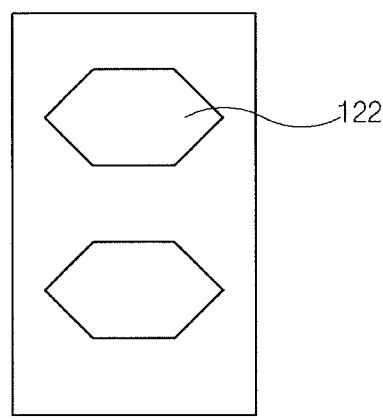
Figure 7H:
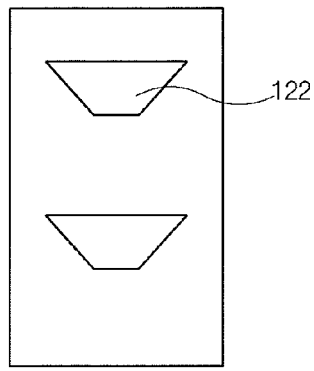

In FIGS. 7A to 7H, each of the plurality of discontinuous regions 122 may have an elliptical shape or a polygonal shape. FIG. 7A shows the discontinuous region 122 of a rectangular shape, and FIG. 7B shows the discontinuous region 122 of an octagonal shape that is a rectangular shape of which edge portions are chamfered. FIG. 7C shows the discontinuous region 122 of a lozenge shape, and FIG. 7D shows the discontinuous region 122 of an elliptical shape. FIG. 7E shows the discontinuous region 122 of a parallelogrammic shape, and FIG. 7F shows the discontinuous region 122 of a dodecagonal shape that is a rectangular shape of which edge rectangular portions are removed. In addition, FIG. 7G shows the discontinuous region 122 of a hexagonal shape, and FIG. 7H shows the discontinuous region 122 of a trapezoidal shape.

The width of each of the plurality of continuous photoresist bars of the photoresist pattern 120 (of FIG. 5) may be optimized by changing the horizontal length A1 of each discontinuous region 122, the vertical length B1 of each discontinuous region 122 and the gap distance C1 between the two adjacent discontinuous regions 122 of the photomask (of FIG. 4). The variations in width and profile of the photoresist pattern 120 according to the horizontal length A1, the vertical length B1 and the gap distance C1 will be illustrated hereinafter.

Figure 8:
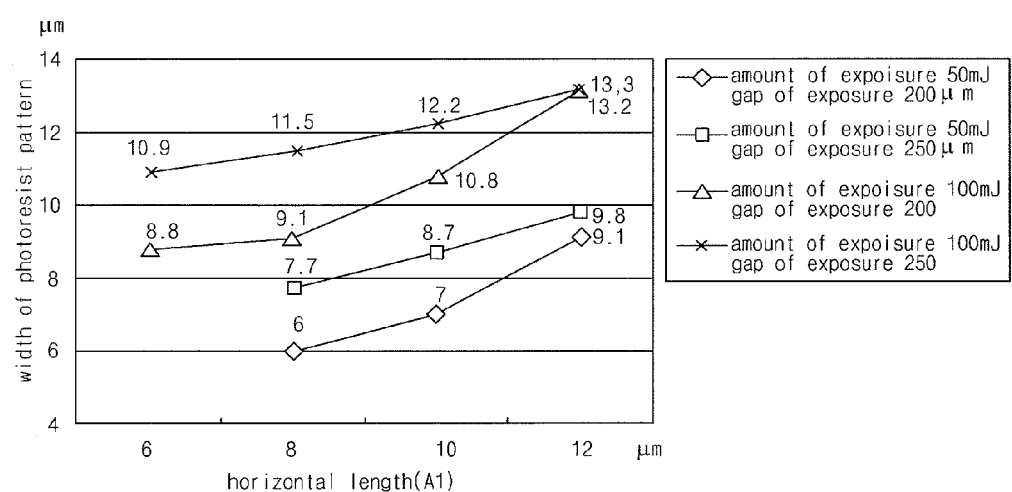
FIG. 8 is a graph showing a width of a photoresist pattern with respect to a horizontal length of a photomask according to a first embodiment of the present invention.
Figure 9A:
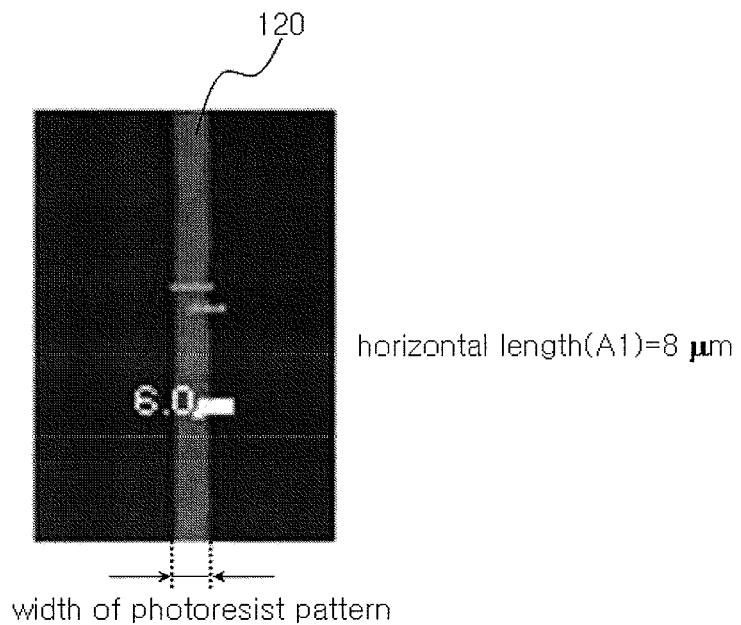
FIGS. 9A to 9C are plan views showing a photoresist pattern with respect to a horizontal length of a photomask according to a first embodiment of the present invention.
Figure 9B:
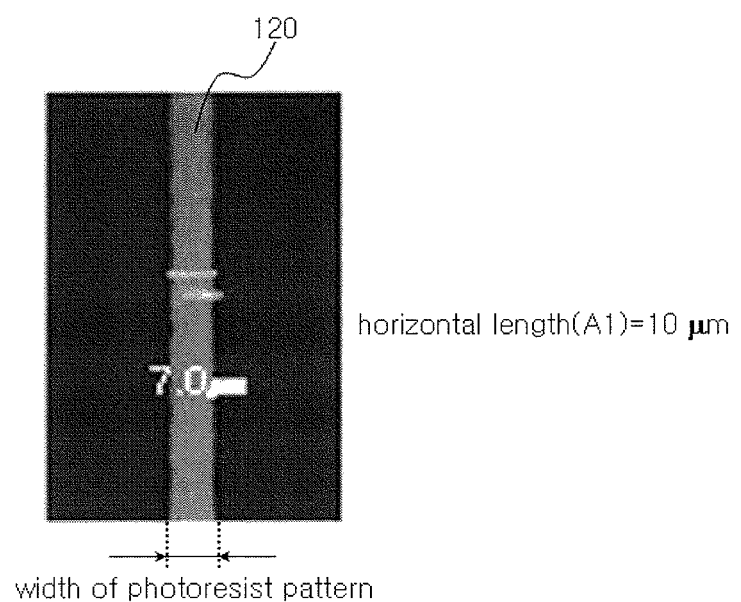
Figure 9C:
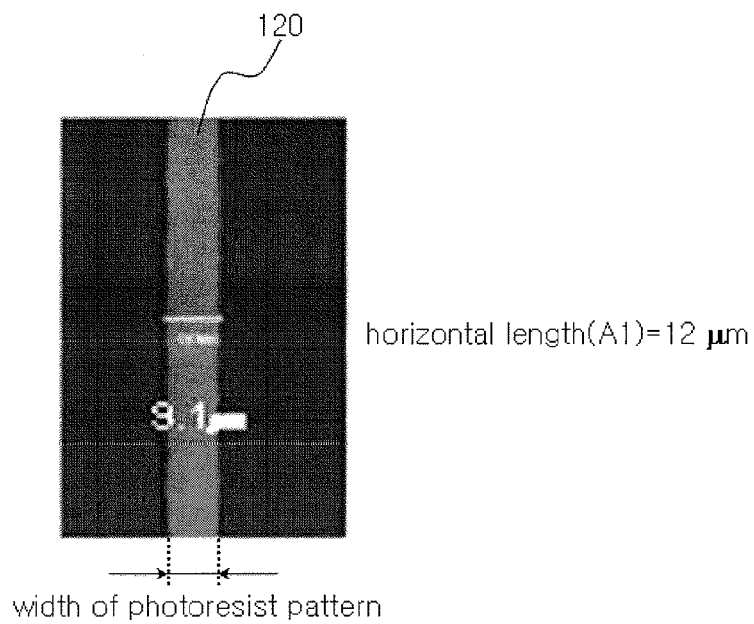

FIG. 8 is a graph showing a width of a photoresist pattern with respect to a horizontal length of a photomask according to a first embodiment of the present invention, and FIGS. 9A to 9C are plan views showing a photoresist pattern with respect to a horizontal length of a photomask according to a first embodiment of the present invention.

In FIG. 8, when the vertical length B1 of each discontinuous region 122 (of FIG. 4) and the gap distance C1 between the two adjacent discontinuous regions 122 of the photomask 116 (of FIG. 4) are fixed as about 2.5 μm and about 10 μm, respectively, the width of each continuous photoresist bar of the photoresist pattern 120 (of FIG. 5) increases as the horizontal length A1 of each discontinuous region 122 increases.

In addition, when the horizontal length A1 of each discontinuous region 122 is fixed, the width of each continuous photoresist bar of the photoresist pattern 120 increases according to the amount of exposure and the gap of exposure between the substrate 112 (of FIG. 3) and the photomask 116 (of FIG. 3). Accordingly, when the horizontal length A1, the vertical length B1 and the gap distance C1 are fixed, the width of each continuous photoresist bar of the photoresist pattern 120 increases as the amount of exposure and the gap of exposure increase.

For example, when the horizontal length A1, the vertical length B1, the gap distance C1 and the gap of exposure are fixed as about 8 μm, about 2.5 μm, about 10 μm and about 200 μm, respectively, the width of each continuous photoresist bar for the amount of exposure of about 50 mJ is about 6 μm and the width of each continuous photoresist bar for the amount of exposure of about 100 mJ is about 9.1 μm. In addition, when the horizontal length A1, the vertical length B1, the gap distance C1 and the amount of exposure are fixed as about 10 μm, about 2.5 μm, about 10 μm and about 50 mJ, respectively, the width of each continuous photoresist bar for the gap of exposure of about 200 μm is about 7 μm and the width of each continuous photoresist bar for the gap of exposure of about 250 μm is about 8.7 μm.

When the horizontal length A1 and the amount of exposure are about 6 μm and about 50 mJ, respectively, the photoresist pattern 120 is not obtained because the light having a sufficient intensity is not transmitted to the photoresist film 114 (of FIG. 3A).

In FIGS. 9A to 9C, when the vertical length B1, the gap distance C1, the amount of exposure and the gap of exposure are fixed as about 2.5 μm, about 10 μm, about 50 mJ and about 200 μm, respectively, the widths of each continuous photoresist bar for the horizontal lengths A1 of about 8 μm, about 10 μm and about 12 μm are about 6 μm, about 7 μm and about 9.1 μm, respectively.

Figure 10:
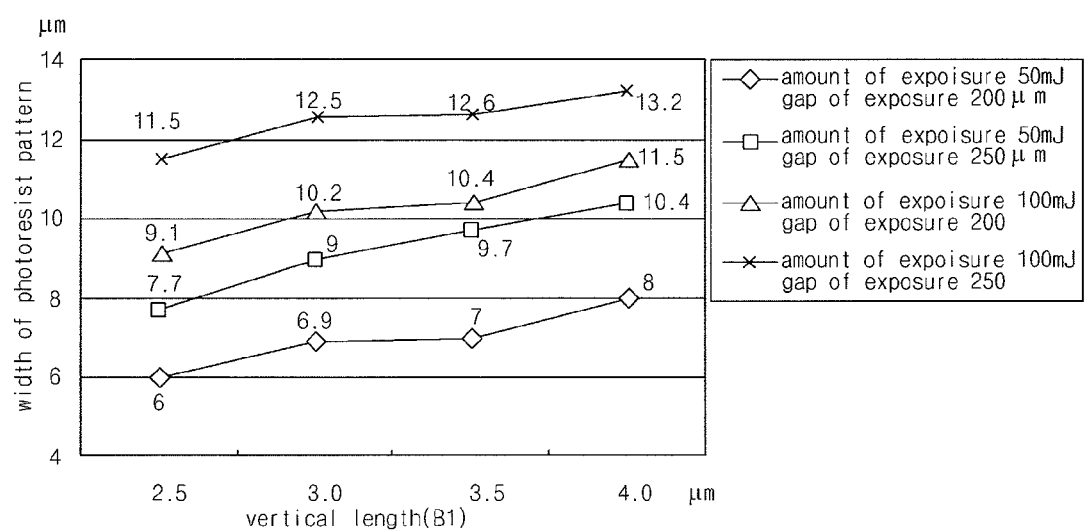
FIG. 10 is a graph showing a width of a photoresist pattern with respect to a vertical length of a photomask according to a first embodiment of the present invention.
Figure 11A:
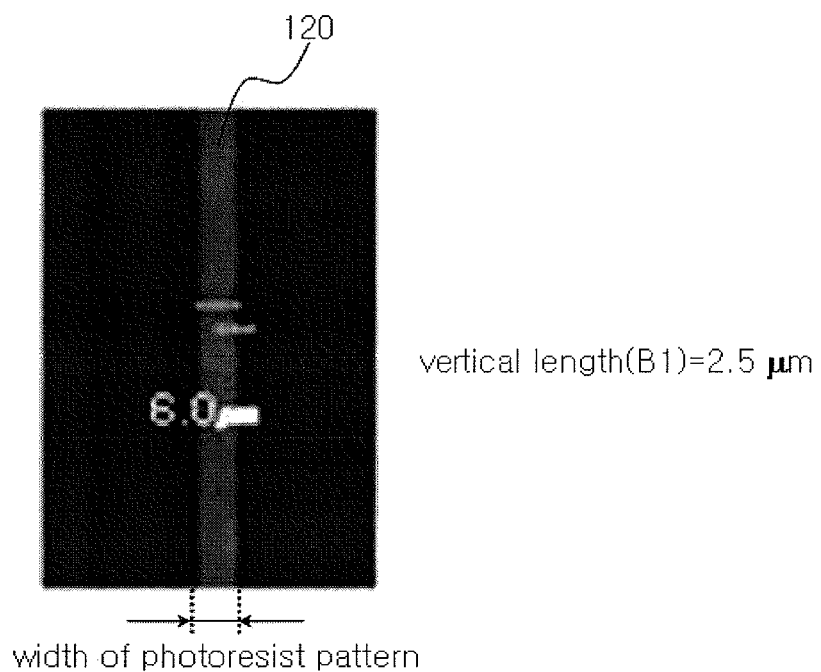
FIGS. 11A to 11D are plan views showing a photoresist pattern with respect to a vertical length of a photomask according to a first embodiment of the present invention.
Figure 11B:
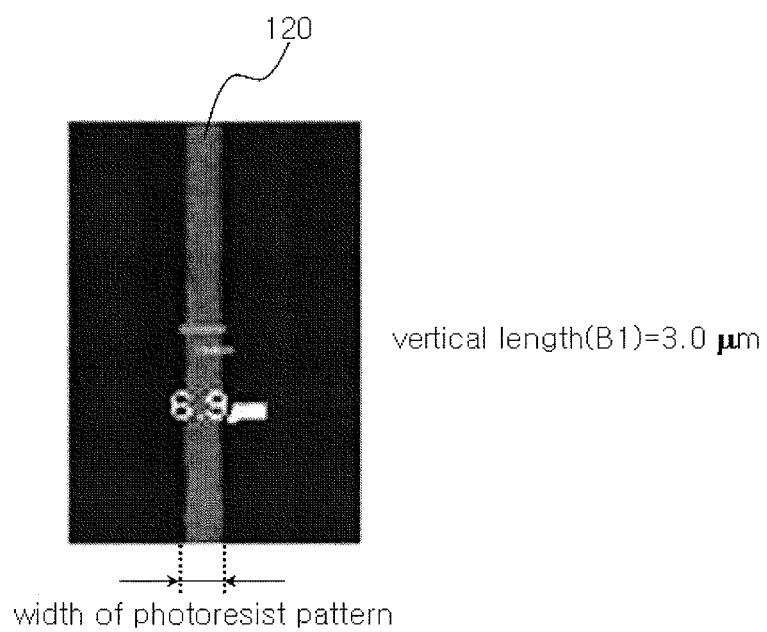
Figure 11C:
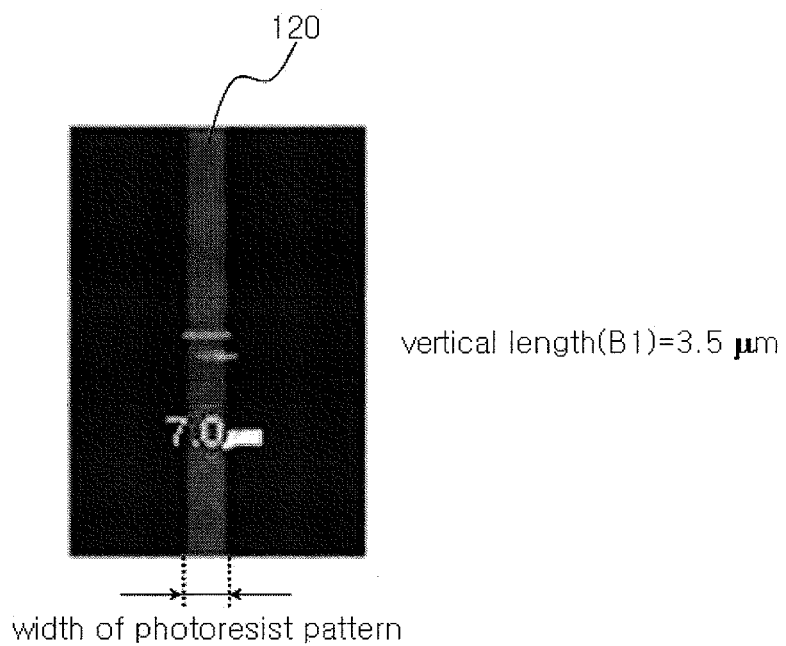
Figure 11D:
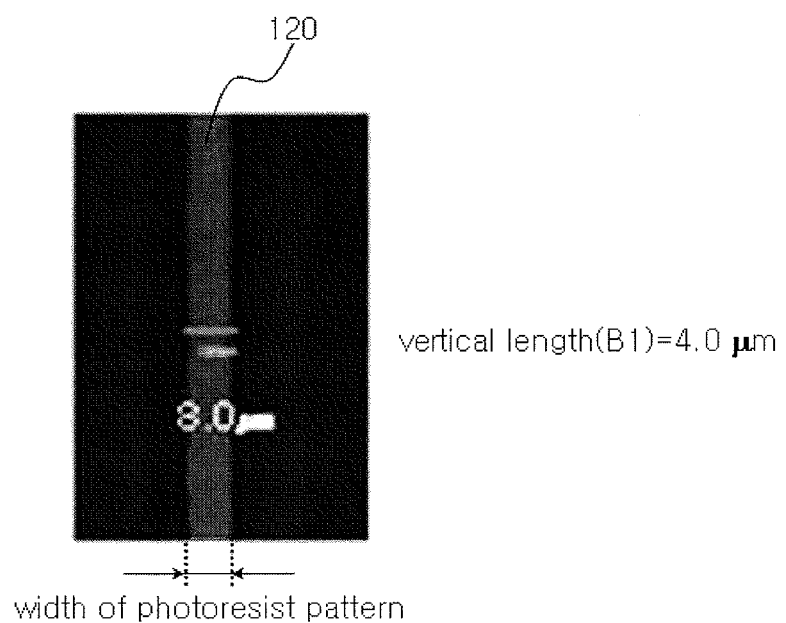

FIG. 10 is a graph showing a width of a photoresist pattern with respect to a vertical length of a photomask according to a first embodiment of the present invention, and FIGS. 11A to 11D are plan views showing a photoresist pattern with respect to a vertical length of a photomask according to a first embodiment of the present invention.

In FIG. 10, when the horizontal length A1 of each discontinuous region 122 (of FIG. 4) and the gap distance C1 between the two adjacent discontinuous regions 122 of the photomask 116 (of FIG. 4) are fixed as about 8 μm and about 10 μm, respectively, the width of each continuous photoresist bar of the photoresist pattern 120 (of FIG. 5) increases as the vertical length B1 of each discontinuous region 122 increases.

In addition, when the vertical length B1 of each discontinuous region 122 is fixed, the width of each continuous photoresist bar of the photoresist pattern 120 increases according to the amount of exposure and the gap of exposure between the substrate 112 (of FIG. 3) and the photomask 116 (of FIG. 3). Accordingly, when the horizontal length A1, the vertical length B1 and the gap distance C1 are fixed, the width of each continuous photoresist bar of the photoresist pattern 120 increases as the amount of exposure and the gap of exposure increase.

In FIGS. 11A to 11D, when the horizontal length A1, the gap distance C1, the amount of exposure and the gap of exposure are fixed as about 8 μm, about 10 μm, about 50 mJ and about 200 μm, respectively, the widths of each continuous photoresist bar for the vertical lengths B1 of about 2.5 μm, about 3.0 μm, about 3.5 μm and about 4.0 μm are about 6 μm, 6.9 μm, 7 μm and 8 μm, respectively.

Figure 12:
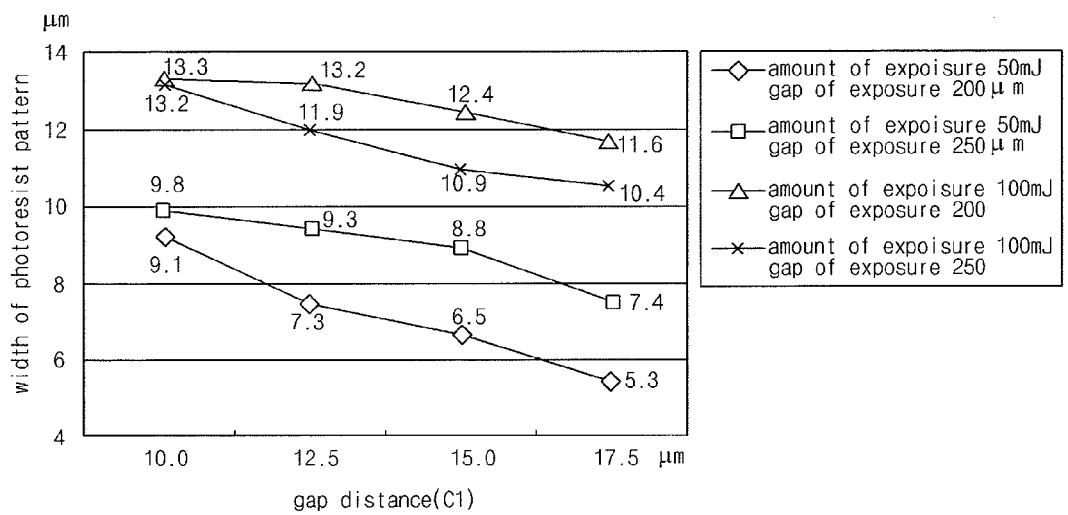
FIG. 12 is a graph showing a width of a photoresist pattern with respect to a gap distance of a photomask according to a first embodiment of the present invention.
Figure 13A:
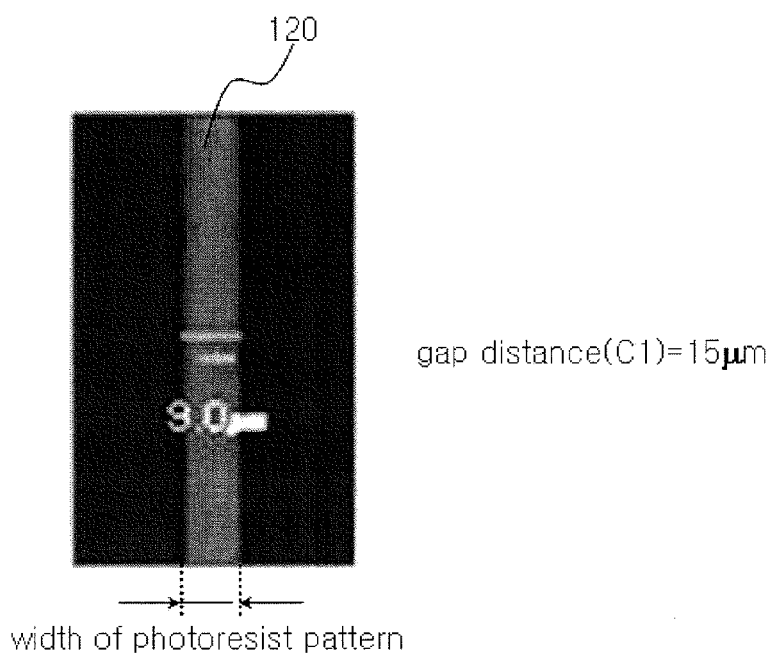
FIGS. 13A to 13C are plan views showing a photoresist pattern with respect to a gap distance of a photomask according to a first embodiment of the present invention.
Figure 13B:
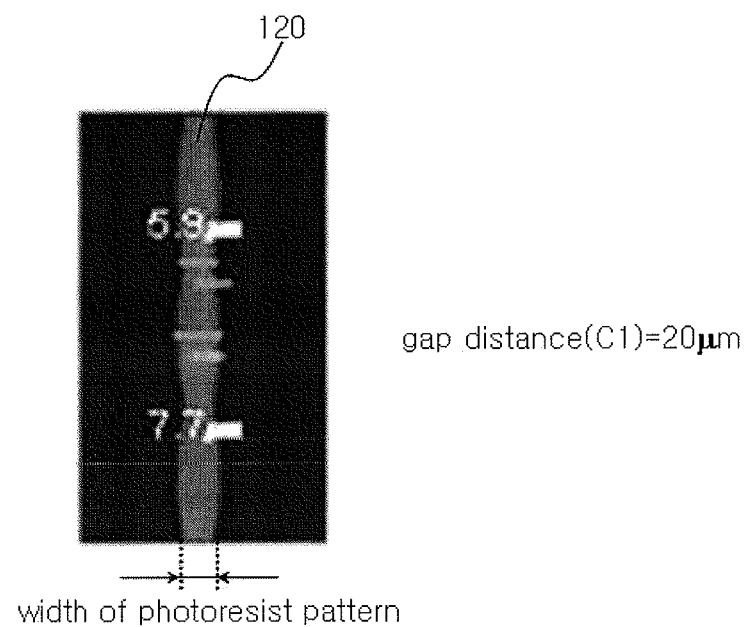
Figure 13C:
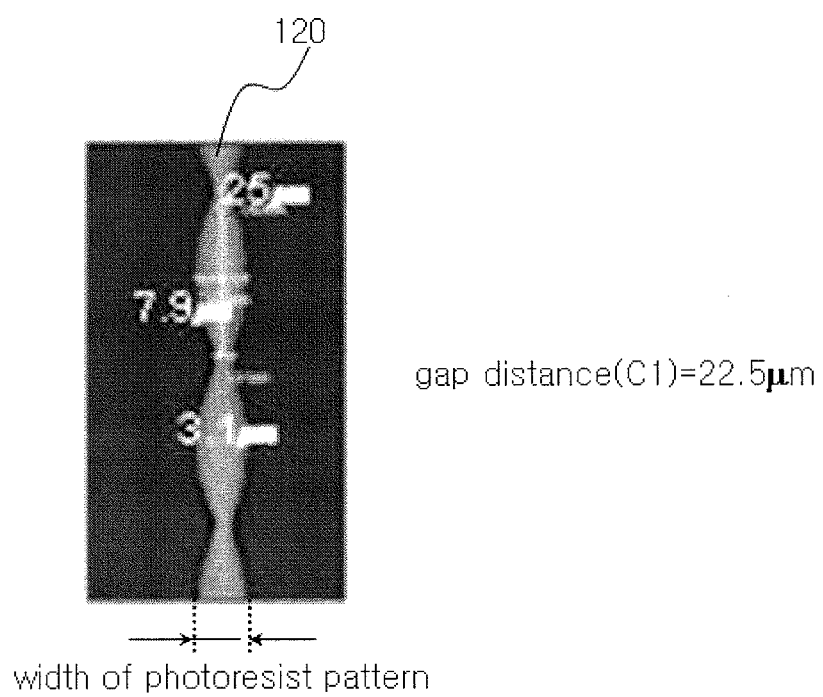
Figure 14A:
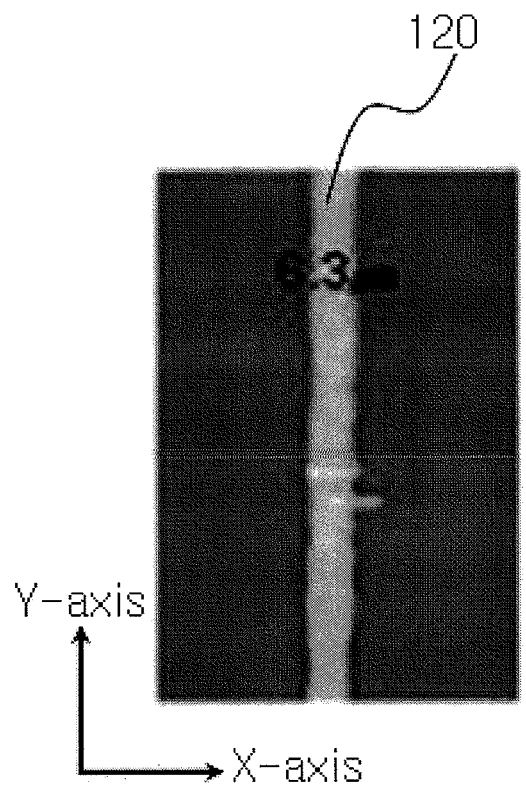
FIGS. 14A to 14F are plan views showing a photoresist pattern with respect to an angle of a plurality of discontinuous regions of a photomask according to a first embodiment of the present invention.
Figure 14B:
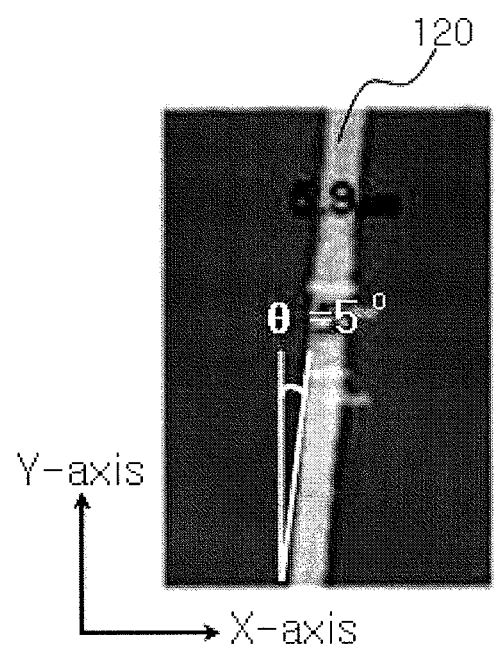
Figure 14C:
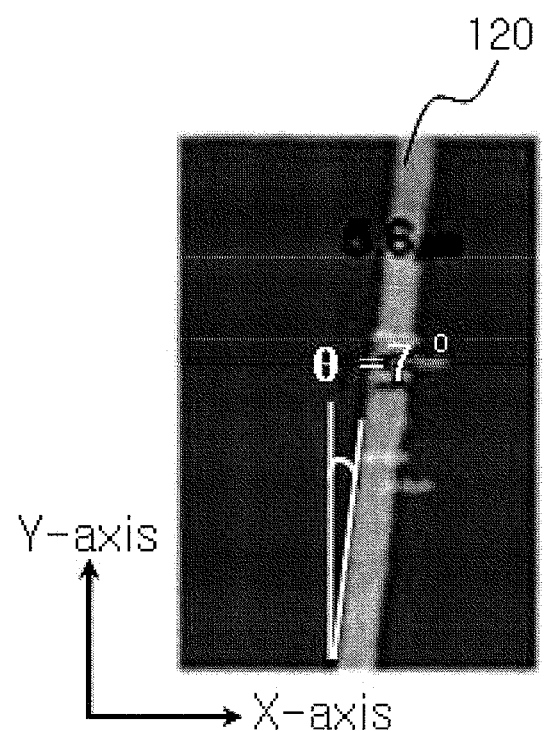
Figure 14D:
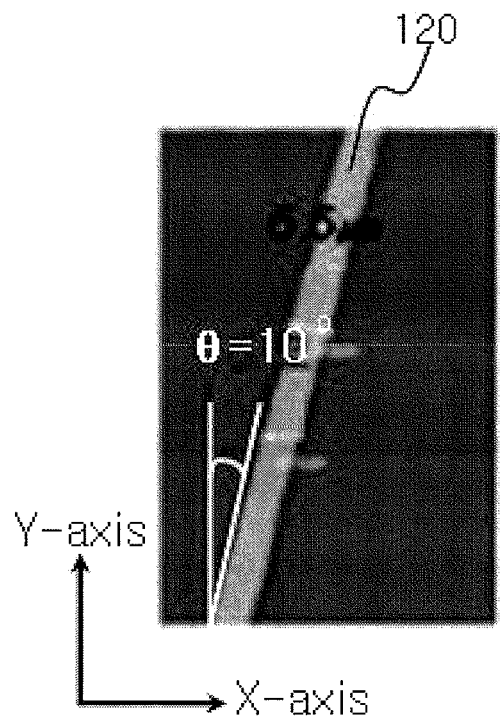
Figure 14E:
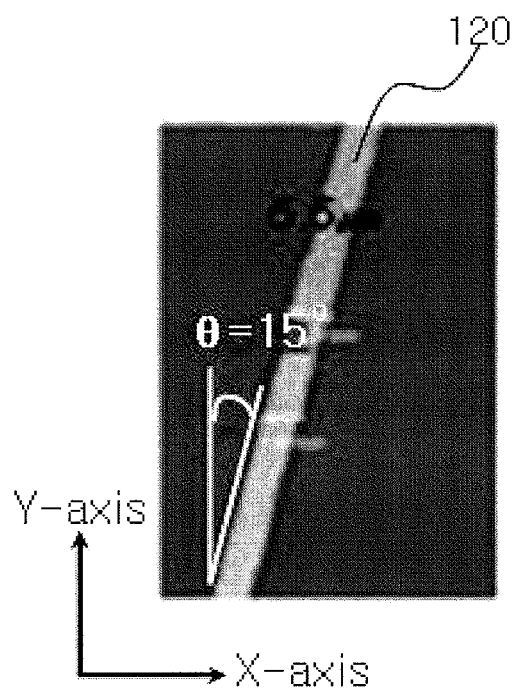
Figure 14F:
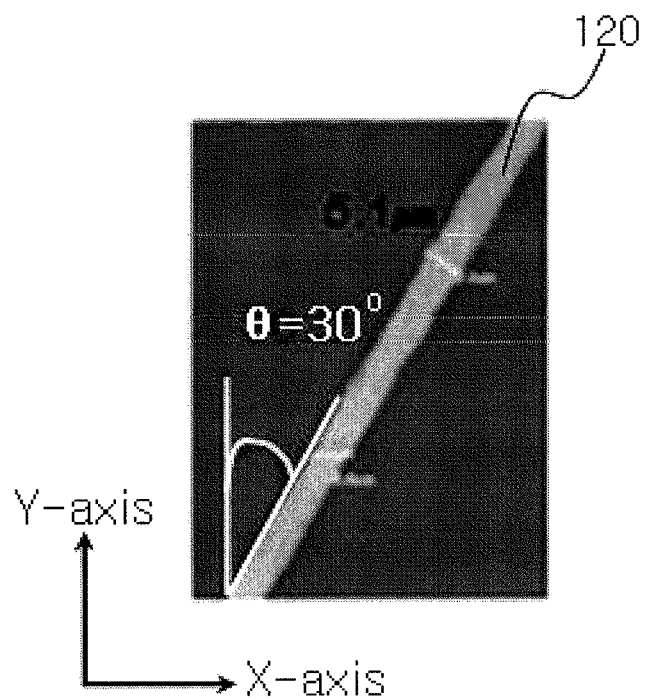

FIG. 12 is a graph showing a width of a photoresist pattern with respect to a gap distance of a photomask according to a first embodiment of the present invention, and FIGS. 13A to 13C are plan views showing a photoresist pattern with respect to a gap distance of a photomask according to a first embodiment of the present invention.

In FIG. 12, when the horizontal and vertical lengths A1 and B1 of each discontinuous region 122 (of FIG. 4) of the photomask 116 (of FIG. 4) are fixed as about 12 μm and about 2 μm, respectively, the width of each continuous photoresist bar of the photoresist pattern 120 (of FIG. 5) increases as the gap distance C1 of the two adjacent discontinuous regions 122 increases.

In addition, when the gap distance C1 of the two adjacent discontinuous regions 122 is fixed, the width of each continuous photoresist bar of the photoresist pattern 120 increases according to the amount of exposure and the gap of exposure between the substrate 112 (of FIG. 3) and the photomask 116 (of FIG. 3). Accordingly, when the horizontal length A1, the vertical length B1 and the gap distance C1 are fixed, the width of each continuous photoresist bar of the photoresist pattern 120 increases as the amount of exposure and the gap of exposure increase.

For example, when the horizontal length A1, the vertical length B1, the amount of exposure and the gap of exposure are fixed as about 12 μm, about 2 μm, about 50 mJ and about 200 μm, respectively, the widths of each continuous photoresist bar for the gap distances C1 of about 10 μm, about 12.5 μm, about 15 μm and about 17.5 μm are about 9.1 μm, about 7.3 μm, about 6.5 μm and about 6.5 μm, respectively.

However, when the gap distance C1 increases over a predetermined value, the normal photoresist pattern 120 cannot be obtained. Although the normal photoresist pattern 120 is formed when the gap distance C1 is about 15 μm in FIG. 13A, the abnormal photoresist pattern 120 having the non-uniform width is formed when the gap distance C1 is one of about 20 μm and about 22.5 μm over about 17.5 μm in FIGS. 13B and 13C. Accordingly, the photomask 116 having the gap distance C1 over about 17.5 μm cannot be applied to the step of forming the photoresist pattern 120.

FIGS. 14A to 14F are plan views showing a photoresist pattern with respect to an angle of a plurality of discontinuous regions of a photomask according to a first embodiment of the present invention.

In FIGS. 14A to 14F, the plurality of discontinuous regions 122 (of FIG. 4) has an angle θ with respect to the Y-axis where the plurality of discontinuous regions 122 are separately disposed. When the horizontal length A1 (of FIG. 4), the vertical length B1 (of FIG. 4) and the gap distance C1 (of FIG. 4) are fixed as about 10 μm, about 3 μm and about 15 μm, respectively, the width of each continuous photoresist bar of the photoresist pattern 120 (of FIG. 5) decreases as the angle θ of the plurality of discontinuous regions 122 increases.

For example, the photoresist patterns 120 having the widths of each continuous photoresist bar of about 6.3 μm, about 5.9 μm, about 5.6 μm, about 5.6 μm, about 5.5 μm and about 5.1 μm are formed by the photomask 116 having the angles θ of the plurality of discontinuous regions 122 of about 0°, about 5°, about 7°, about 10°, about 15° and about 30°, respectively.

Accordingly, the photoresist pattern 120 of a stripe shape that surpasses the resolution limit of the proximate exposure apparatus is formed by using the photomask 116 including the plurality of discontinuous regions 122 that has one of shapes shown in FIGS. 7A to 7H. The horizontal length A1, the vertical length B1, the gap distance C1 and the angle of the plurality of discontinuous regions 122 may be determined based on the results shown in FIGS. 8 to 14F.

In FIGS. 8, 10 and 12, the variations in width of the photoresist pattern 120 are inspected by changing the horizontal length A1, the vertical length B1 and the gap distance C1 within a range of about 1 μm to about 20 μm. In another embodiment, the horizontal length A1, the vertical length B1 and the gap distance C1 may be changed within a range of about 20 μm to about 1000 μm for forming the designed photoresist pattern 120.

Figure 15A:
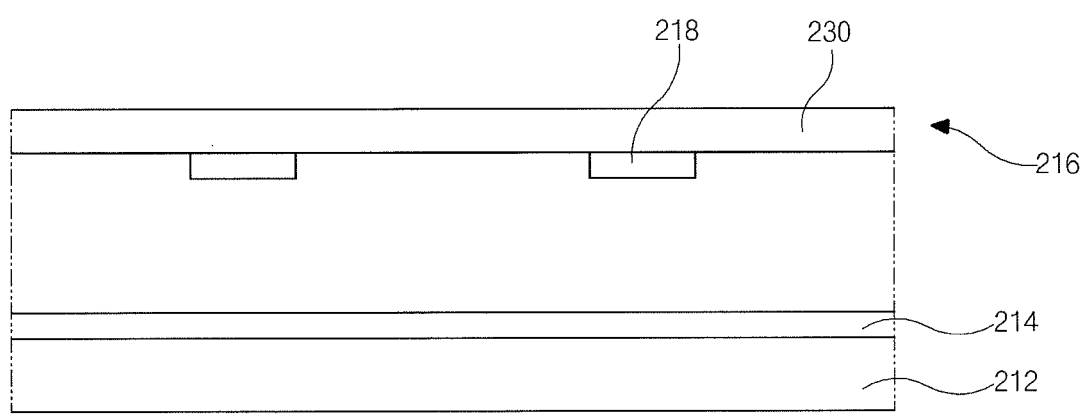
FIGS. 15A and 15B are cross-sectional views showing a method of forming a photoresist pattern according to a second embodiment.
Figure 15B:
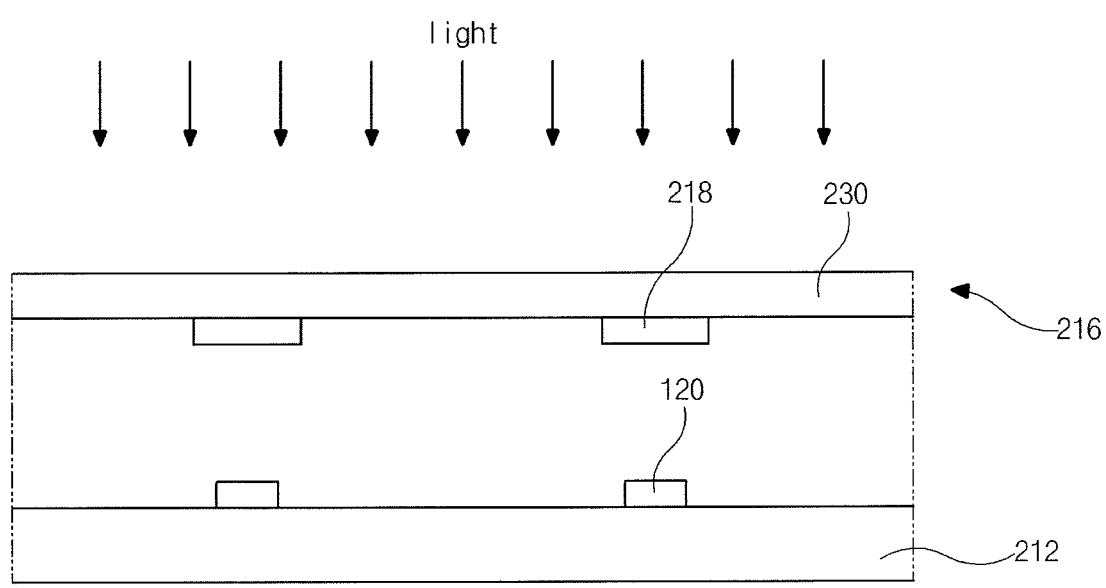
Figure 16:
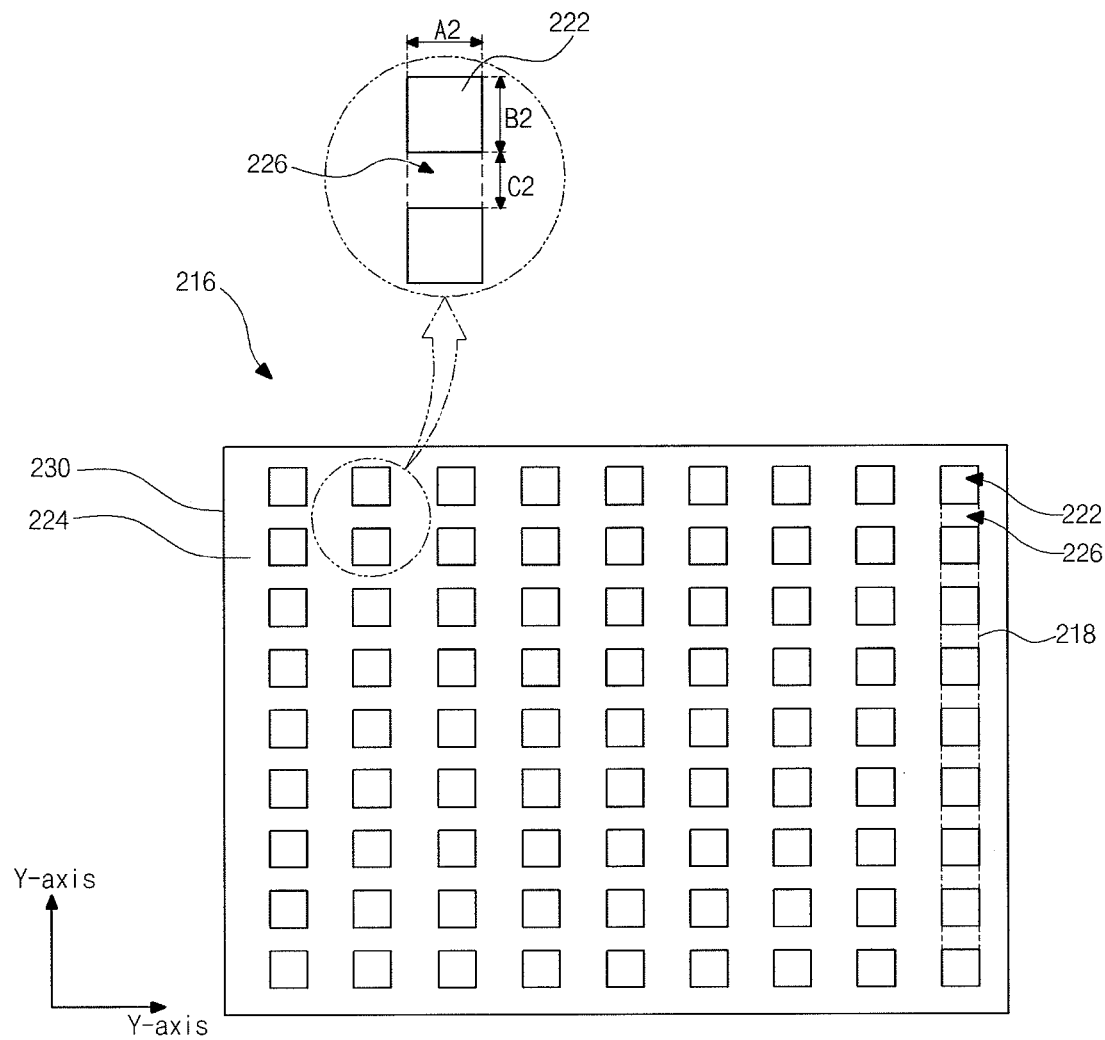
FIG. 16 is a plan view showing a photomask according to a second embodiment of the present invention.
Figure 17:
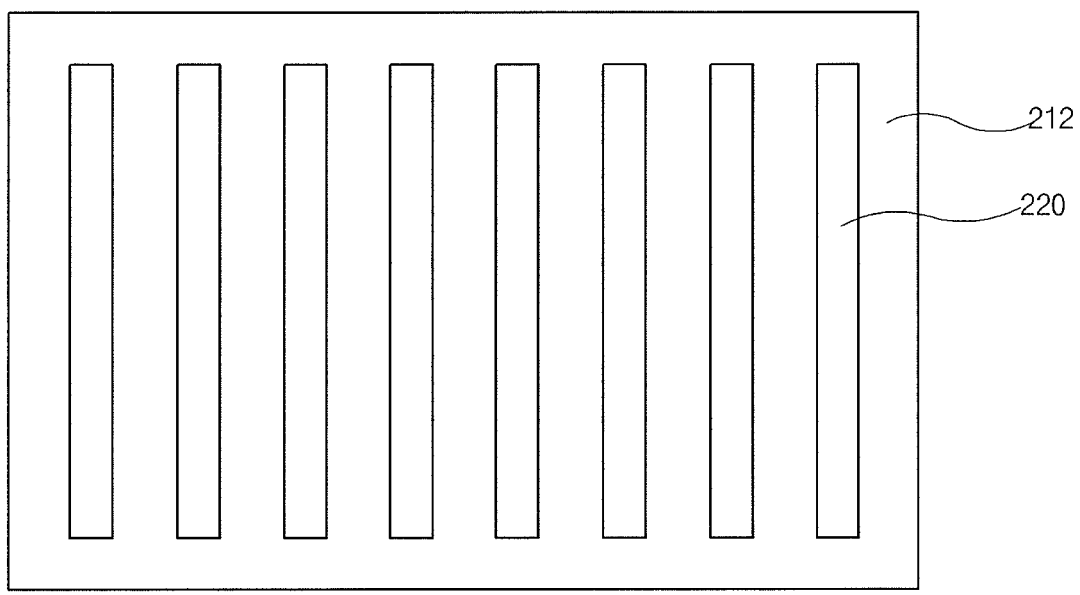
FIG. 17 is a plan view showing a photoresist pattern formed by using a photomask according to a second embodiment of the present invention.

FIGS. 15A and 15B are cross-sectional views showing a method of forming a photoresist pattern according to a second embodiment, FIG. 16 is a plan view showing a photomask according to a second embodiment of the present invention, and FIG. 17 is a plan view showing a photoresist pattern formed by using a photomask according to a second embodiment of the present invention.

In FIG. 15A, a photoresist (PR) film 214 is formed on a substrate 212 by coating a positive type photoresist material. The substrate 212 having the photoresist film 214 is transferred to a proximate type exposure apparatus (not shown) and a photomask 216 is disposed over the substrate 212. In the proximate type exposure apparatus, a distance between the photomask 216 and the photoresist film 214 on the substrate 212 may be kept to be several hundreds micrometers.

In FIG. 15B, a light is irradiated onto the photoresist film 214 (of FIG. 3A) on the substrate 212 through the photomask 216 and the exposed photoresist film 214 is developed to form a photoresist pattern 220.

In FIGS. 16 and 17, the photomask 216 for a positive photoresist material includes a transparent substrate 230 and a transcribing pattern 218 and a peripheral transparent region 224 on the transparent substrate 230. The transcribing pattern 218 includes a plurality of bars and the peripheral transparent region 224 surrounds the transcribing pattern 218. The transcribing pattern 218 and the peripheral transparent region 224 constitute a stripe shape. Each bar of the transcribing pattern 218 includes a plurality of discontinuous regions 222 and a plurality of light controlling regions 226. The plurality of discontinuous regions 222 function as a blocking area which blocks a light, and the peripheral transparent region 224 and the plurality of light controlling regions 226 function as a transmissive area where a light passes.

The plurality of discontinuous regions 222 are disposed along a first direction (a Y-axis) discontinuously and each of the plurality of light controlling regions 226 is disposed between the two adjacent discontinuous regions 222. When a light is irradiated through the photomask 216, destructive interference by diffraction occurs at the plurality of light controlling regions 222 of the transcribing pattern 218. As a result, the photoresist film 214 (of FIG. 15A) corresponding to the plurality of discontinuous regions 222 and the plurality of light controlling regions 226 are not exposed to the light. Although the plurality of discontinuous regions 222 has discontinuities, a photoresist pattern 220 including a plurality of continuous photoresist bars that correspond to the plurality of bars of the transcribing pattern 218 is formed on the substrate 212 due to destructive interference by diffraction. Accordingly, the fine photoresist pattern 220 of a stripe shape including the plurality of continuous photoresist bars is obtained by using the photomask 216 having the transcribing pattern 218 that includes the plurality of discontinuous regions 222 and the plurality of light controlling regions 226.

The shape of the photoresist pattern 220 obtained by using the photomask 216 may be adjusted by a horizontal length A2 of each discontinuous region 222, a vertical length B2 of each discontinuous region 222, a gap distance C2 between the two adjacent discontinuous regions 222 (i.e., a vertical length of each light controlling region 226) and an angle of the plurality of discontinuous regions 222.

Consequently, in a proximate type exposure apparatus according to the present invention, a photoresist pattern having a plurality of continuous photoresist bars that surpass a resolution limit of the proximate type exposure apparatus is formed by using a photomask having a transcribing pattern that includes a plurality of discontinuous regions and a plurality of light controlling regions. As a result, the fine photoresist pattern is formed by a proximate type exposure apparatus having a low price and a short process time as compared with a projection type exposure apparatus, and production yield is improved.

In addition, a width of the photoresist pattern is adjusted by controlling a horizontal length of each discontinuous region, a vertical length of each discontinuous region and a gap distance between the two adjacent discontinuous regions with a sufficient gap between the substrate and the photomask kept. Accordingly, contamination of the photomask due to a photoresist film on the substrate is minimized.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A photomask for a proximate type exposure apparatus, comprising:
    a transparent substrate; and
    a transcribing pattern and a peripheral region surrounding the transcribing pattern on the transparent substrate, the transcribing pattern having at least one bar including a plurality of discontinuous regions and a plurality of light controlling regions between adjacent two of the plurality of discontinuous regions, the plurality of discontinuous regions and the plurality of light controlling regions capable of forming at least one continuous photoresist bar by exposing and developing a photoresist material.

2. The photomask according to claim 1, wherein the transcribing pattern and the peripheral region constitute a stripe shape and the at least one continuous photoresist bar constitutes a stripe shape.

3. The photomask according to claim 1, wherein the plurality of discontinuous regions function as a transmissive area where a light passes and the plurality of light controlling regions function as a blocking area which blocks a light when the photoresist material has a negative type.

4. The photomask according to claim 1, wherein the plurality of discontinuous regions function as a blocking area which blocks a light and the plurality of light controlling regions function as a transmissive area where a light passes when the photoresist material has a positive type.

5. The photomask according to claim 1, wherein at least one of the plurality of discontinuous regions has one of a rectangular shape, an octagonal shape, a lozenge shape, an elliptical shape, a parallelogrammic shape, a dodecagonal shape, a hexagonal shape and a trapezoidal shape.

6. The photomask according to claim 1, wherein the at least one continuous photoresist bar is fanned to have a continuity from the adjacent two of the plurality of discontinuous regions having a discontinuity due to diffraction.

7. The photomask according to claim 1, wherein the at least one continuous photoresist bar has a width surpassing a resolution limit of the proximate type exposure apparatus.

8. A method of forming a photoresist pattern, comprising:
forming a photoresist film on a substrate;
disposing a photomask over the photoresist film, the photomask having a transcribing pattern and a peripheral region surrounding the transcribing pattern, the transcribing pattern having at least one bar including a plurality of discontinuous regions and a plurality of light controlling regions between adjacent two of the plurality of discontinuous regions; and
forming the photoresist pattern by exposing and developing the photoresist film, the photoresist pattern having at least one continuous photoresist bar corresponding to the plurality of discontinuous regions and the plurality of light controlling regions.

9. The method according to claim 8, wherein a width of the at least one continuous photoresist bar increases as an amount of exposure and a gap of exposure between the substrate and the photomask increases.

10. The method according to claim 8, wherein the transcribing pattern and the peripheral region constitute a stripe shape and the at least one continuous photoresist bar constitutes a stripe shape.

11. The method according to claim 8, wherein the plurality of discontinuous regions function as a transmissive area where a light passes and the plurality of light controlling regions function as a blocking area which blocks a light when the photoresist film has a negative type.

12. The method according to claim 11, wherein a width of the at least one continuous photoresist bar increases as a horizontal length and a vertical length of each of the plurality of discontinuous regions increase.

13. The method according to claim 11, wherein a width of the at least one continuous photoresist bar decreases as a gap distance between the adjacent two of the plurality of discontinuous regions increases.

14. The method according to claim 11, wherein a width of the at least one continuous photoresist bar decreases as an angle of the plurality of discontinuous regions with respect to a vertical direction where the plurality of discontinuous regions are separately disposed.

15. The method according to claim 8, wherein the plurality of discontinuous regions function as a blocking area which blocks a light and the plurality of light controlling regions function as a transmissive area where a light passes when the photoresist film has a positive type.

16. The method according to claim 8, wherein at least one of the plurality of discontinuous regions has one of a rectangular shape, an octagonal shape, a lozenge shape, an elliptical shape, a parallelogrammic shape, a dodecagonal shape, a hexagonal shape and a trapezoidal shape.

17. The method according to claim 8, wherein the at least one continuous photoresist bar is formed to have a continuity from the adjacent two of the plurality of discontinuous regions having a discontinuity due to diffraction.

18. The method according to claim 8, wherein the at least one continuous photoresist bar has a width surpassing a resolution limit of a proximate type exposure apparatus.

\* \* \* \* \*